United States Patent
Kawashima et al.

(10) Patent No.: US 7,981,760 B2
(45) Date of Patent: Jul. 19, 2011

(54) METHOD FOR MANUFACTURING NONVOLATILE STORAGE ELEMENT AND METHOD FOR MANUFACTURING NONVOLATILE STORAGE DEVICE

(75) Inventors: Yoshio Kawashima, Osaka (JP); Takumi Mikawa, Shiga (JP); Takeshi Takagi, Kyoto (JP); Koji Arita, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/669,812

(22) PCT Filed: May 7, 2009

(86) PCT No.: PCT/JP2009/001994
§ 371 (c)(1),
(2), (4) Date: Jan. 20, 2010

(87) PCT Pub. No.: WO2009/136493
PCT Pub. Date: Nov. 12, 2009

(65) Prior Publication Data
US 2010/0190313 A1 Jul. 29, 2010

(30) Foreign Application Priority Data
May 8, 2008 (JP) .................................. 2008-121948

(51) Int. Cl.
*H01L 21/00* (2006.01)
(52) U.S. Cl. ................. 438/385; 438/382; 257/E21.645
(58) Field of Classification Search .................. 438/385, 438/382, 383, 384, 95
See application file for complete search history.

(56) References Cited

U.S. PATENT DOCUMENTS

| | | | |
|---|---|---|---|
| 6,955,992 B2 | 10/2005 | Zhang et al. | |
| 6,972,985 B2 | 12/2005 | Rinerson et al. | |
| 7,027,322 B2 | 4/2006 | Suzuki et al. | |
| 7,169,637 B2 | 1/2007 | Zhang et al. | |
| 2003/0032206 A1* | 2/2003 | Hsu et al. | 438/3 |
| 2003/0143853 A1* | 7/2003 | Celii et al. | 438/694 |

(Continued)

FOREIGN PATENT DOCUMENTS

JP  2003-273330  9/2003

(Continued)

OTHER PUBLICATIONS

International Search Report issued Jul. 21, 2009 in International (PCT) Application No. PCT/JP2009/001994.

*Primary Examiner* — Charles D Garber
*Assistant Examiner* — Reema Patel
(74) *Attorney, Agent, or Firm* — Wenderoth, Lind & Ponack, LLP.

(57) ABSTRACT

A method for manufacturing a nonvolatile storage element that minimizes shape shift between an upper electrode and a lower electrode, and which includes: depositing, in sequence, a connecting electrode layer which is conductive, a lower electrode layer and a variable resistance layer which are made of a non-noble metal nitride and are conductive, an upper electrode layer made of noble metal, and a mask layer; forming the mask layer into a predetermined shape; forming the upper electrode layer, the variable resistance layer, and the lower electrode layer into the predetermined shape by etching using the mask layer as a mask; and removing, simultaneously, the mask and a region of the connecting electrode layer that has been exposed by the etching.

16 Claims, 9 Drawing Sheets

U.S. PATENT DOCUMENTS

| | | |
|---|---|---|
| 2003/0175998 A1 | 9/2003 | Nagano et al. |
| 2005/0040482 A1 | 2/2005 | Suzuki et al. |
| 2005/0079727 A1 | 4/2005 | Zhang et al. |
| 2005/0243595 A1 | 11/2005 | Rinerson et al. |
| 2006/0003489 A1 | 1/2006 | Zhang et al. |
| 2006/0109704 A1 | 5/2006 | Seo et al. |
| 2008/0026539 A1* | 1/2008 | Kokaze et al. .............. 438/393 |
| 2008/0048164 A1 | 2/2008 | Odagawa |

FOREIGN PATENT DOCUMENTS

| | | |
|---|---|---|
| JP | 2003-318371 | 11/2003 |
| JP | 2004-273656 | 9/2004 |
| JP | 2005-109446 | 4/2005 |
| JP | 2006-019729 | 1/2006 |
| JP | 2006-135335 | 5/2006 |
| JP | 2008-021750 | 1/2008 |
| WO | 2005/117021 | 12/2005 |

* cited by examiner

METHOD FOR MANUFACTURING NONVOLATILE STORAGE ELEMENT AND METHOD FOR MANUFACTURING NONVOLATILE STORAGE DEVICE

TECHNICAL FIELD

The present invention relates to a method for manufacturing a nonvolatile storage element and a method for manufacturing a nonvolatile storage device for storing data using a material whose resistance value reversibly varies according to application of electrical pulse.

BACKGROUND ART

With the development of digital technology in electronic devices, recent years have seen a rise in the demand for storage elements which have larger capacity and are nonvolatile, for storing data such as music, images, and information. As one measure to respond to such demand, attention has been placed on storage elements which use a material whose resistance value varies according to the electrical pulse applied, and continues to hold such state.

FIG. 9 is a cross-sectional view of a main section which shows the structure of a conventional example of such a nonvolatile storage element (for example, see PTL 1). As shown in FIG. 9, this nonvolatile storage element is a memory element (nonvolatile storage element) including one resistor 932 and one switching structure (transistor). In this nonvolatile storage element, a source region 921a and a drain region 921b are formed on a semiconductor substrate 920, a gate insulating layer 922 and a gate electrode 923 are formed on the semiconductor substrate 920 which contacts with the source region 921a and the drain region 921b, a contact plug 925 is formed in an inter-layer insulating film 924 with the contact plug 925 being electrically connected to a lower electrode 931, and the resistor 932 and an upper electrode 933 are sequentially formed on the lower electrode 931.

As substances making up the resistor 932, nickel oxide (NiO), titanium oxide ($TiO_2$), hafnium oxide (HfO), niobium oxide ($NbO_2$), zinc oxide (ZnO), zirconium oxide ($ZrO_2$), tungsten oxide ($WO_3$), cobalt oxide (CoO), GST ($Ge_2Sb_2Te_5$), and PCMO ($Pr_xCa_{1-x}MnO_3$), and so on, are used. Such transition metal oxides are known to show a particular resistance value when a particular voltage is applied or by the application of a particular voltage through a particular application method, and continue to hold such resistance value until a new voltage or current is applied.

Citation List

[Patent Literature]
[PTL 1]
Japanese Unexamined Patent Application Publication No. 2006-135335

SUMMARY OF INVENTION

Technical Problem

Although the electrode material used as the lower electrode or the upper electrode is not particularly described in the nonvolatile storage element of the aforementioned conventional example, there is a particular limitation on the electrodes which causes the resistor to reversibly vary, and the material is limited to particular materials. For example, when the nonvolatile storage element as in the aforementioned conventional example is manufactured by using platinum (Pt) which is representative of generally difficult-to-etch materials, and so on, in the lower electrode and the upper electrode or in either one, variable resistance is facilitated and the characteristics of the nonvolatile storage element become stable. However, since Pt is a difficult-to-etch material, when a conventional photoresist is used as a mask, the photoresist is etched during etching and its dimensions are reduced, the dimensional difference between the upper electrode and the lower electrode becomes big since Pt assumes a tapered shape, the shift in the shape of the resistor becomes big, and thus there is a tendency for the variation in the characteristics of the nonvolatile storage elements to become big.

Furthermore, although the shape of Pt after etching, the dimensional difference between the upper electrode and the lower electrode, and the shift in the shape of the resistor tend to improve when a conductive material having a lower etching rate than the photoresist is used as a mask in the etching of Pt, the mask becomes tapered in shape. When an inter-layer contact is connected to the upper electrode-side in such state, the connection becomes unstable since the connection area of the inter-layer contact is not flat, and this becomes a cause of characteristic variation.

As such, although the mask needs to be removed, etching for mask removal etches even up to the inter-layer insulating film located at the lower part of the nonvolatile storage element and it is difficult to control the etched-out amount for the inter-layer insulating film, and thus the shape of the nonvolatile storage element varies and the variation in characteristics becomes big.

The present invention is conceived in order to solve the aforementioned problem and has as an object to provide: a method for manufacturing a nonvolatile storage device in which the etched-out amount for the inter-layer insulating film is controllable even when a difficult-to-etch material is used in the upper electrode and the lower electrode or in either one, and which has little shape variation; and a method for manufacturing a nonvolatile storage device including such nonvolatile storage element.

Solution to Problem

In order to solve the aforementioned problem, the manufacturing method of a nonvolatile storage element in an aspect of the present invention is a manufacturing method of a nonvolatile storage element which includes a connecting electrode layer which is conductive, a lower electrode layer which is made of a non-noble metal nitride and is conductive, an upper electrode layer which is formed above the lower electrode layer and is made of a noble metal, and a variable resistance layer disposed between the lower electrode layer and the upper electrode layer and whose resistance value varies reversibly based on an electrical signal applied between the lower electrode layer and the upper electrode layer, the method including: depositing, in sequence, the connecting electrode layer, the lower electrode layer, the variable resistance layer, the upper electrode layer, and a mask layer; forming the mask layer into a predetermined shape, using a photoresist film as a mask; performing continuous three-layer etching on the upper electrode layer, the variable resistance layer, and the lower electrode layer, using the mask layer that has been formed into the predetermined shape as a mask, to form the upper electrode layer, the variable resistance layer, and the lower electrode layer into the predetermined shape; and removing, simultaneously, the mask layer and a region of the connecting electrode layer exposed in the performing of the three-layer etching.

In addition, in the performing of the three-layer etching, the upper electrode layer, the variable resistance layer, and the lower electrode layer may be formed into the predetermined shape in a single etching process using the mask layer as a mask.

In addition, an etching rate of the mask layer in the performing of the three-layer etching may be lower than at least an etching rate of the photoresist film in the performing of the three-layer etching.

Furthermore, the manufacturing method of a nonvolatile storage element in another aspect of the present invention is a manufacturing method of a nonvolatile storage element which includes a connecting electrode layer which is conductive, an upper electrode layer which is formed above the connecting electrode layer and is made of a noble metal, and a variable resistance layer disposed between the connecting electrode layer and the upper electrode layer and whose resistance value varies reversibly based on an electrical signal applied between the connecting electrode layer and the upper electrode layer, the method including: depositing, in sequence, the connecting electrode layer, the variable resistance layer, the upper electrode layer, and a mask layer; forming the mask layer into a predetermined shape, using a photoresist film as a mask; performing two-layer etching on the upper electrode layer and the variable resistance layer, using the mask layer that has been formed into the predetermined shape as a mask, to form the upper electrode layer and the variable resistance layer into the predetermined shape; and removing, simultaneously, the mask layer and a region of the connecting electrode layer exposed in the performing of the two-layer etching.

In addition, in the performing of the two-layer etching, the upper electrode layer and the variable resistance layer may be formed into the predetermined shape in a single etching process using the mask layer as a mask.

In addition, an etching rate of the mask layer in the performing of the two-layer etching may be lower than at least an etching rate of the photoresist film in the performing of the two-layer etching.

Furthermore, in the manufacturing method of a nonvolatile storage element in the present invention, the connecting electrode layer may be made of a material having the same etching rate as the mask layer or the same material as the mask layer.

By using such a manufacturing method, the connecting electrode layer covering the inter-layer insulating film located below the nonvolatile storage element is also removed simultaneously by etching during the removal of the mask layer, and thus the etched-out amount for the inter-layer insulating film can be controlled to a minimum, and the dimensional difference between the upper electrode layer and the lower electrode layer which contact with the variable resistance layer or the dimensional difference between the upper electrode layer and the connecting electrode layer which contact with the variable resistance layer can be minimized, and thus it is possible to reliably obtain stable shapes having minimal shape shift. In addition, since the mask layer is removed, the upper electrode layer attains a flat shape such that inter-layer contacts can be reliably connected to the upper electrode layer, and thus stable characteristics can be obtained.

Furthermore, in the manufacturing method of a nonvolatile storage element in the present invention, the upper electrode layer may be made of Pt or Ir. In addition, the connecting electrode layer and the mask layer may be made of Titanium Aluminum Nitride (TiAlN).

By using such a manufacturing method, the etching rate of Pt is 7.5 times higher than the etching rate of TiAlN when using a mixed gas having argon (Ar) and chlorine (Cl) as main components in the three-layer etching or the two-layer etching, and thus TiAlN has sufficient functional capability as a mask layer in the etching of Pt. Furthermore, Ir also has the same functional capability since it has about the same etching rate. Furthermore, TiAlN is conductive and thus has sufficient functional capability as a connecting electrode layer.

The manufacturing method of a nonvolatile storage device in another aspect of the present invention involves manufacturing a nonvolatile storage device which includes a semiconductor substrate, word lines and bit lines which are formed on the semiconductor substrate and arranged so as to intersect with each other, transistors each provided for a corresponding one of intersections of the word lines and the bit lines, and nonvolatile storage elements each provided for a corresponding one of the transistors, each of the nonvolatile storage elements including a connecting electrode layer which is conductive, a lower electrode layer which is made of a non-noble metal nitride and is conductive, an upper electrode layer which is formed above the lower electrode layer and is made of a noble metal, and a variable resistance layer disposed between the lower electrode layer and the upper electrode layer and whose resistance value varies reversibly based on an electrical signal applied between the lower electrode layer and the upper electrode layer, the method including: depositing, in sequence, the connecting electrode layer, the lower electrode layer, the variable resistance layer, the upper electrode layer, and a mask layer; forming the mask layer into a predetermined shape, using a photoresist film as a mask; performing three-layer etching on the upper electrode layer, the variable resistance layer, and the lower electrode layer, using the mask layer that has been formed into the predetermined shape as a mask, to form the upper electrode layer, the variable resistance layer, and the lower electrode layer into the predetermined shape; removing, simultaneously, the mask layer and a region of the connecting electrode layer exposed in the performing of the three-layer etching; and forming, on the semiconductor substrate, the corresponding one of the transistors and a semiconductor integrated circuit which are electrically connected to the connecting electrode layer and the upper electrode layer.

In addition, in the performing of the three-layer etching, the upper electrode layer, the variable resistance layer, and the lower electrode layer may be formed into the predetermined shape in a single etching process using the mask layer as a mask.

Furthermore, the manufacturing method of a nonvolatile storage device in another aspect of the present invention involves manufacturing a nonvolatile storage device which includes a semiconductor substrate, word lines and bit lines which are formed on the semiconductor substrate and arranged so as to intersect with each other, transistors each provided for a corresponding one of intersections of the word lines and the bit lines, and nonvolatile storage elements each provided for a corresponding one of the transistors, each of the nonvolatile storage elements including a connecting electrode layer which is conductive, an upper electrode layer which is formed above the connecting electrode layer and is made of a noble metal, and a variable resistance layer disposed between the connecting electrode layer and the upper electrode layer and whose resistance value varies reversibly based on an electrical signal applied between the connecting electrode layer and the upper electrode layer, the method including: depositing, in sequence, the connecting electrode layer, the variable resistance layer, the upper electrode layer, and a mask layer; forming the mask layer into a predetermined shape, using a photoresist film as a mask; performing two-layer etching on the upper electrode layer and the variable resistance layer, using the mask layer that has been formed into the predetermined shape as a mask, to form the upper electrode layer and the variable resistance layer into the predetermined shape; removing, simultaneously, the mask layer and a region of the connecting electrode layer exposed in the performing of the two-layer etching; and forming, on the semiconductor substrate, the corresponding one of the transistors and a semiconductor integrated circuit which are electrically connected to the connecting electrode layer and the upper electrode layer.

In addition, in the performing of the two-layer etching, the upper electrode layer and the variable resistance layer may be formed into the predetermined shape in a single etching process using the mask layer as a mask.

Advantageous Effects of Invention

With the method for manufacturing the nonvolatile storage element and the method for manufacturing the nonvolatile storage device according to the present invention, it is possible to minimize the dimensional difference between the upper electrode (upper electrode layer) and the lower electrode (lower electrode layer contacting with the variable resistance layer or connecting electrode layer contacting with the variable resistance layer), a stable shape with minimal shape shift can be reliably obtained, and stable characteristics can be obtained.

(Further Information About Technical Background for this Application)

The disclosure of Japanese Patent Application No. 2008-121948 filed on May 8, 2008 including specification, drawings and claims is incorporated herein by reference in its entirety.

DESCRIPTION OF EMBODIMENTS

Hereinafter, an embodiment of the present invention shall be described with reference to the Drawings. It should be noted that the same reference signs are assigned to the same components and their description shall not be repeated. Furthermore, for convenience, there are cases where parts are magnified for illustration.

First Embodiment

Figure 1A:
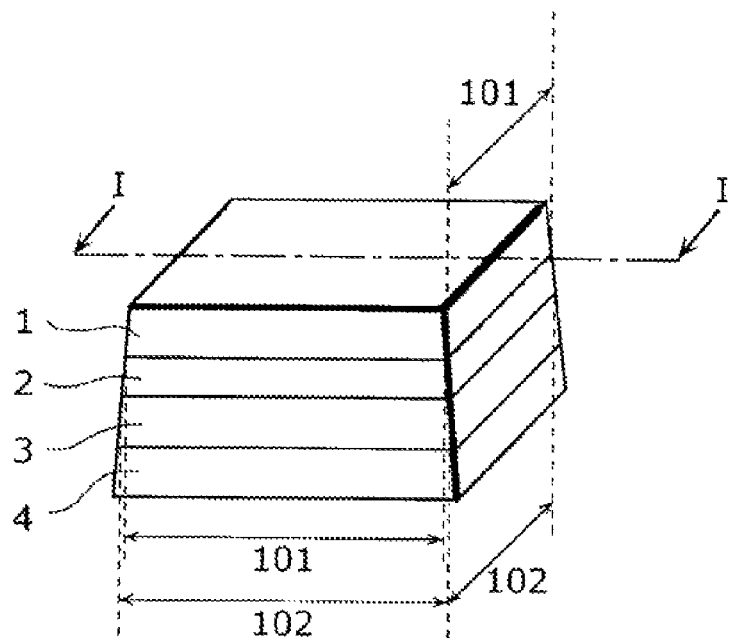
FIG. 1(a) is a perspective view showing schematically the structure of the main section of a storage portion of a nonvolatile storage element according to a first embodiment of the present invention.
Figure 1B:
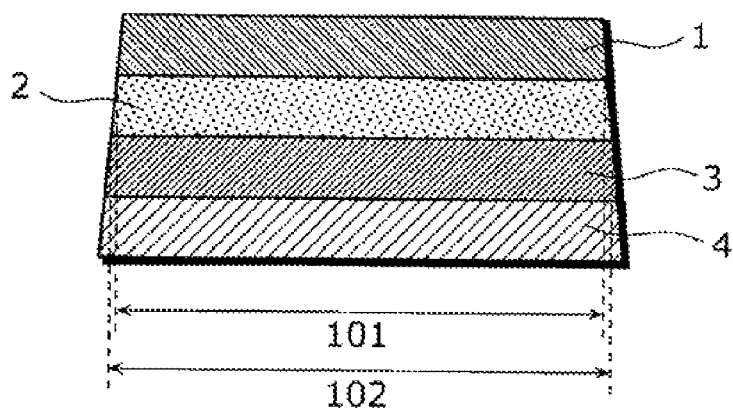
FIG. 1(b) is a cross-sectional view showing a cross-section along the I-I line in FIG. 1(a).

FIG. 1(a) is a perspective view showing schematically the structure of a main section of a storage portion of a nonvolatile storage element 10 in an embodiment of the present invention, and FIG. 1(b) is a cross-sectional view showing a cross-section along the I-I line in FIG. 1(a).

As shown in FIG. 1(a) and FIG. 1(b), the nonvolatile storage element 10 in the present embodiment includes a connecting electrode layer 4, an upper electrode layer 1 formed above a lower electrode layer 3. A variable resistance layer 2 is formed between the lower electrode layer 3 and the upper electrode layer 1.

Figure 2:
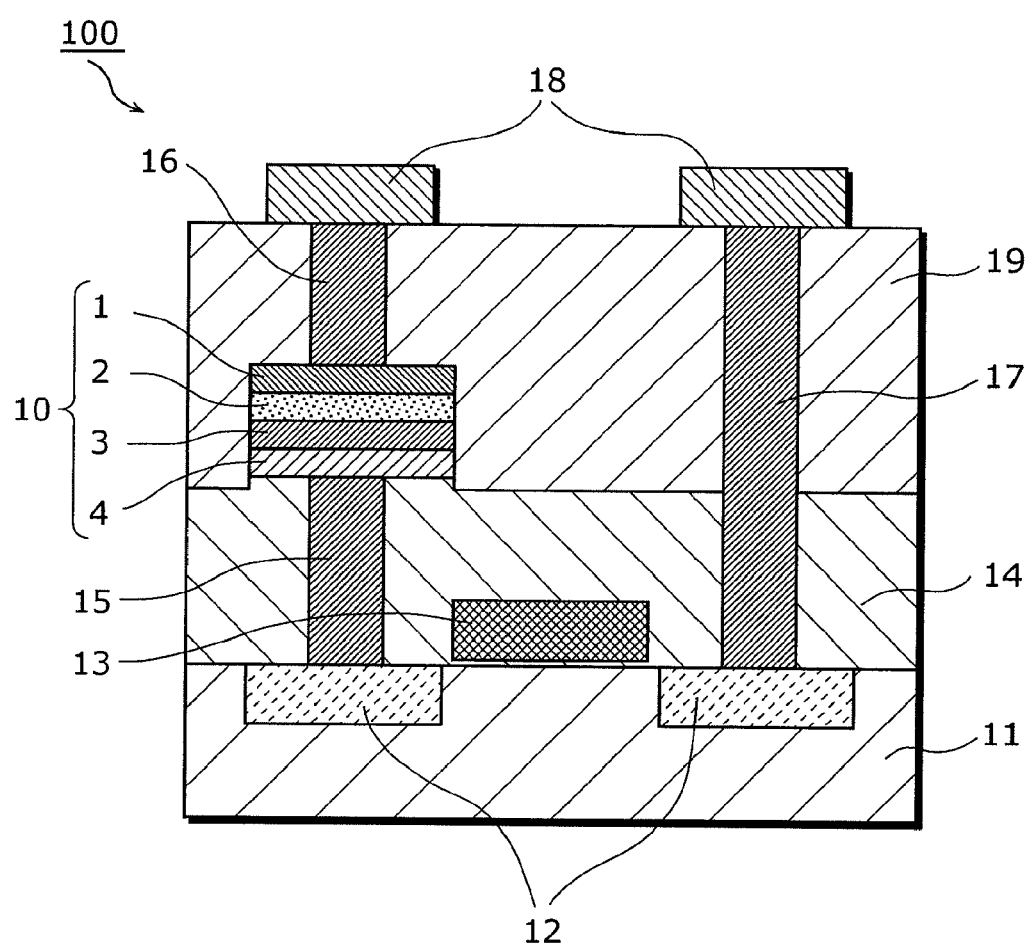
FIG. 2 is a cross-sectional view showing the specific structure of a nonvolatile storage device equipped with the nonvolatile storage element according to the first embodiment of the present invention.

FIG. 2 is a cross-sectional view showing the specific structure of a nonvolatile storage device 100 equipped with the nonvolatile storage element 10 in the first embodiment of the present invention. Furthermore, although several nonvolatile storage elements are formed on a substrate, here, only one nonvolatile storage element is illustrated in order to simplify the Drawings. Furthermore, a part thereof has been magnified to facilitate comprehension.

As shown in FIG. 2, in the nonvolatile storage device 100 in the present embodiment, a gate layer 13 and a source-and-drain layer 12 are formed on a substrate 11, and a first contact 15 which connects with the source-and-drain layer 12 is formed so as to pass through a first insulating layer 14. A connecting electrode layer 4 of the nonvolatile storage device 10 is formed so as to be connected with the first contact. Specifically, the nonvolatile storage element 10, in which the connecting electrode layer 4, the lower electrode layer 3, the variable resistance layer 2, and the upper electrode layer 1 are formed, is formed on the first contact. Subsequently, a second insulating layer 19 is formed so as to cover the gate layer 13, the source-and-drain layer 12, and the first contact 15.

Wirings 18 are formed in a predetermined shape on the upper surface of the second insulating layer 19. In addition, a second contact 16 and a third contact 17 are formed so as to pass through the second insulating layer 19 and the first insulating layer 14. The upper electrode layer 1 of the nonvolatile storage element 10 is connected to the wiring 18 through the second contact 16, and the source-and-drain layer 12 is connected to the wiring 18 through the third contact 17.

The operation of the nonvolatile storage element 10 and the nonvolatile storage device 100 which are structured in the above-described manner shall be described next.

In the nonvolatile storage element 10, a first predetermined electrical pulse (current pulse or voltage pulse) is applied between the lower electrode layer 3 and the upper electrode layer 1. In this case, the electrical pulse is applied to the variable resistance layer 2 located between the lower electrode layer 3 and the upper electrode layer 1. With this, the variable resistance layer 2 becomes a first predetermined resistance value and maintains such state. Then, when a second predetermined electrical pulse is applied between the lower electrode layer 3 and the upper electrode layer 1 in such state, the resistance value of the variable resistance layer 2 becomes a second predetermined resistance value and such state is maintained.

Here, each of the first predetermined resistance value and the second predetermined resistance value are made to correspond to 2 values of binary data, for example, respectively. As a result, by applying the first or the second predetermined electrical pulse to the variable resistance layer 2, binary data can be written into the nonvolatile storage element 10. Furthermore, by supplying the nonvolatile storage element 10 with a voltage or a current, which does not affect the resistance value of the variable resistance layer 2, and detecting such resistance value, the binary data written into the nonvolatile storage element 10 can be read.

In this manner, the variable resistance layer 2 located between the lower electrode layer 3 and the upper electrode layer 1 functions as a storage portion.

In the nonvolatile storage device 100, the nonvolatile storage element 10 is connected to the transistor (voltage or current supply switch) made up of the gate layer 13 and the source-and-drain layer 12 and, by applying a controlled voltage or current to the nonvolatile storage element 10 through such transistor, binary data can be written into the nonvolatile storage element 10 as described above and, in addition, the binary data written into the nonvolatile storage element 10 can be read as described above.

Next, the method for manufacturing the nonvolatile storage element 10 and the nonvolatile storage device 100 shall be described.

FIGS. 3(a) to (c) and FIGS. 4(a) to (c) are cross-sectional views showing the processes in the method for manufacturing the nonvolatile storage element 10 and the nonvolatile storage device 100 in the first embodiment of the present invention.

Figure 3A:
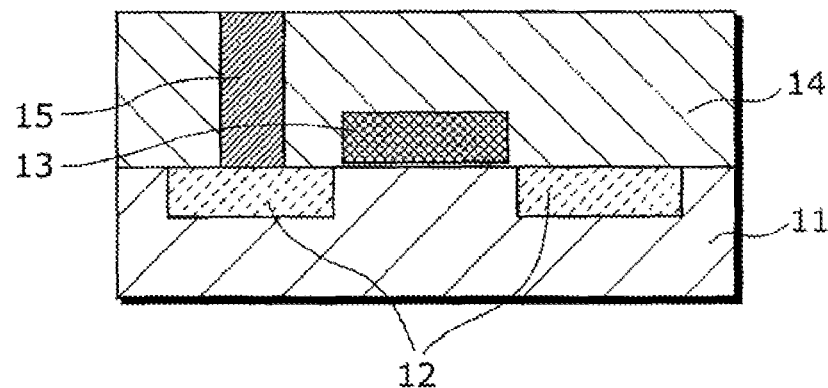
FIGS. 3(a) to (c) are cross-sectional views showing the processes in a method for manufacturing the nonvolatile storage device according to the first embodiment of the present invention.

In the process shown in FIG. 3(a), after forming the gate layer 13 and the source-and-drain layer 12 on the substrate 11 using a conventional semiconductor process, the first insulating layer 14 is formed, and the first contact 15 is formed so as to pass through the first insulating layer 14 and connect with the source-and-drain layer 12.

Figure 3B:
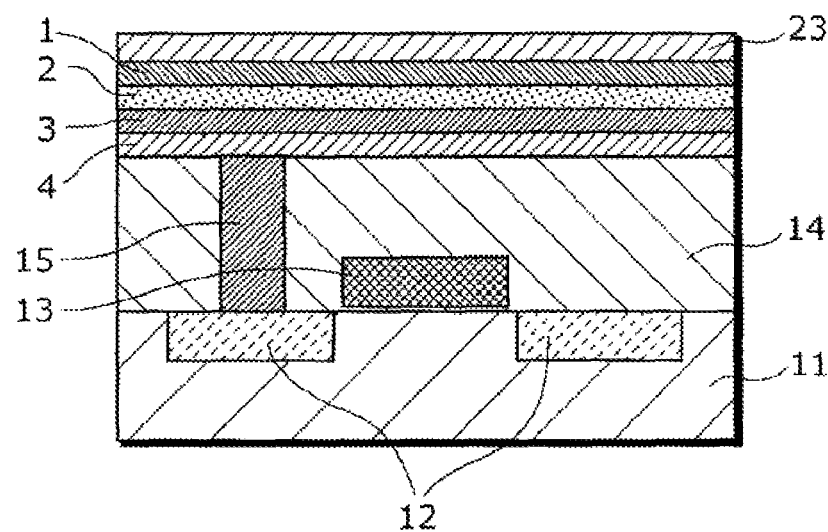

Next, in the process shown in FIG. 3(b), the connecting electrode layer 4, the lower electrode layer 3, the variable resistance layer 2, and the upper electrode layer 1 which form the nonvolatile storage element 10, and a mask layer 23, are formed in such sequence above the first insulating layer 14 so as to cover the first contact 15.

It should be noted that, here, the connecting electrode layer 4, the lower electrode layer 3, the variable resistance layer 2, the upper electrode layer 1, and the mask layer 23 refer, not only to the state in which each of the layers has been etched into the predetermined shape, but also to the yet-unetched state after film-formation.

Figure 3C:
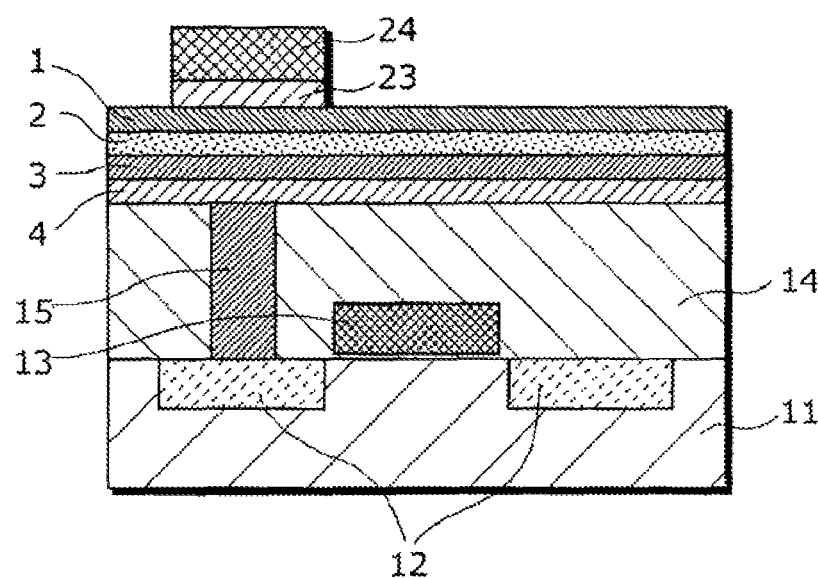

Next, in the process shown in FIG. 3(c), a photoresist film 24 is formed into a predetermined shape using the normal exposure process and developing process, and the mask layer 23 is formed into the predetermined shape using a dry etching process with the photoresist film 24 as a mask.

Figure 4A:
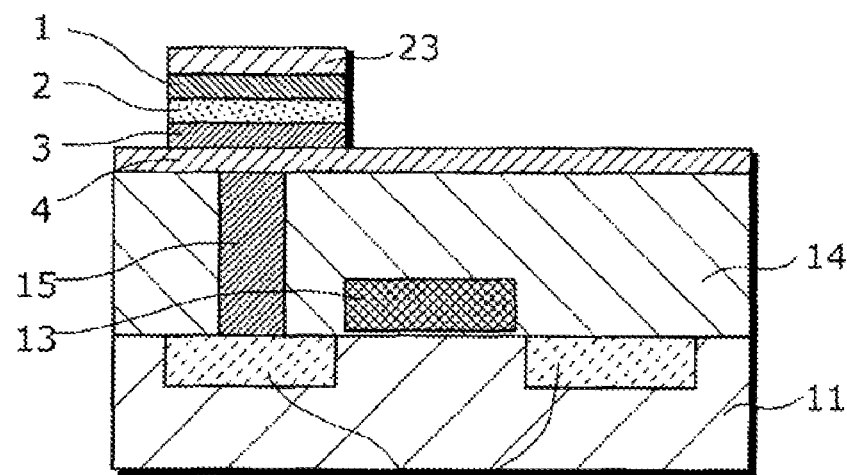
FIGS. 4(a) to (c) are cross-sectional views showing the processes in the method for manufacturing the nonvolatile storage device according to the first embodiment of the present invention.

Next, in the process shown in FIG. 4(a), after removing the photoresist film 24, the upper electrode layer 1, the variable resistance layer 2, and the lower electrode layer 3 are formed into the predetermined shape in a single etching process using a dry etching process with the mask layer 23 as a mask (this process is called the three-layer etching process). By fabricating in a single etching process, the process can be simplified. It should be noted that each of the upper electrode layer 1, the variable resistance layer 2, and the lower electrode layer 3 may be fabricated in separate etching processes using the same mask layer 23. In such a case, the process becomes slightly complicated but optimal etching conditions can be applied in the fabrication of each film.

Figure 4B:
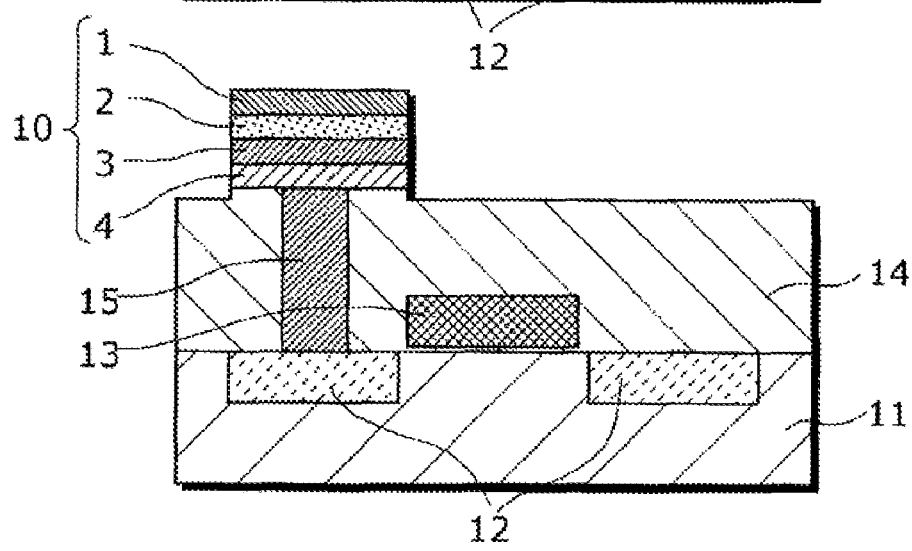

Next, in the process shown in FIG. 4(b), the connecting electrode layer 4 that has been exposed by the three-layer etching process is removed using a dry etching process. At that time, since the mask layer 23 is also removed at the same time, the nonvolatile storage element 10 including the upper electrode layer 1, the variable resistance layer 2, the lower electrode layer 3, and the connecting electrode layer 4, and having a shape in which the side surfaces of the upper electrode layer 1, the variable resistance layer 2, the lower electrode layer 3, and the connecting electrode layer 4 make up the same surface plane, is formed.

Figure 4C:
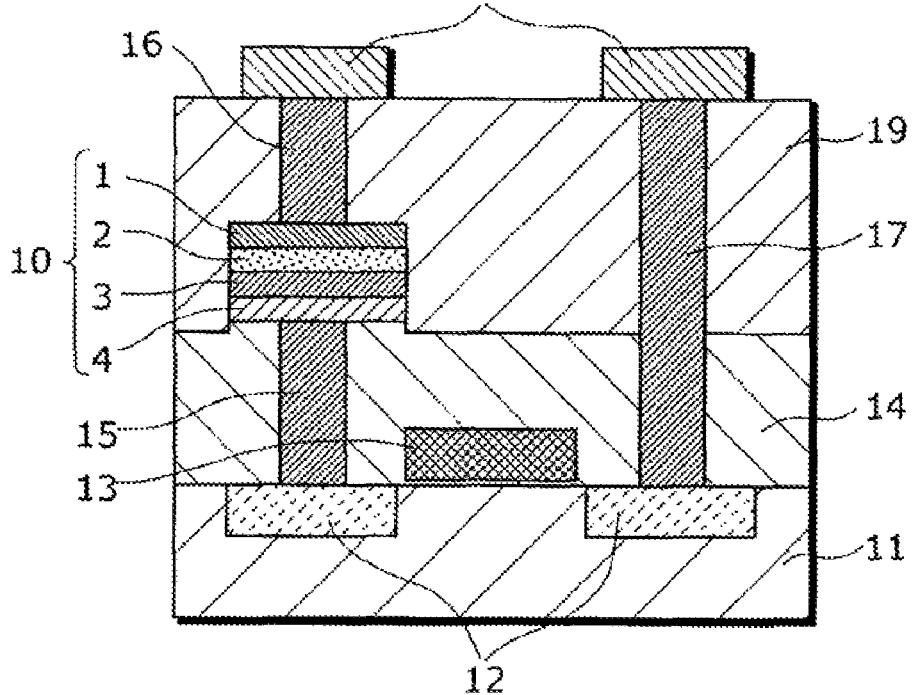

Next, in the process shown in FIG. 4(c), the second insulating layer 19 is formed so as to further cover the nonvolatile storage element 10, the second contact 16 is formed pass through the second insulating layer 19 and connect with the upper electrode layer 1 of the nonvolatile storage element 10, and the third contact 17 is formed so as to pass through the second insulating layer 19 and the first insulating layer 14 and to connect with the source-and-drain layer 12. Next, the wirings 18, which are connected to each of the second contact 16 and the third contact 17, are formed on the upper surface of the first insulating layer 14.

Thus, the nonvolatile storage device 100 equipped with the nonvolatile storage element 10 shown in FIG. 2 is manufactured in such manner. Using the nonvolatile storage element 10, it is possible to manufacture a nonvolatile storage device configured of one transistor and one nonvolatile storage portion, for example.

By adopting such a manufacturing method, it is possible to obtain the nonvolatile storage element 10 in which the upper electrode layer 1 and the lower electrode layer 3 are of the same shape and have a minimal dimensional difference, and thus the nonvolatile storage device 100 having stable characteristics can be obtained. It should be noted that, in the case of the present embodiment, since the processes in the case of manufacturing the storage portion of a conventional nonvolatile storage element can be applied almost without any changes, inexpensive nonvolatile storage elements and nonvolatile storage devices can be obtained steadily.

Next, the method for manufacturing the nonvolatile storage element 10 and the nonvolatile storage device 100 in the first embodiment of the present invention is shown in detail.

In the process shown in FIG. 3(b), when 100 nm of Pt is deposited as the upper electrode layer 1 and 50 nm of TaN is deposited as the lower electrode layer 3, 100 nm of TiAlN is deposited as the mask layer 23, 70 nm of TiAlN is deposited as the connecting electrode layer 4, and 30 nm of $TaO_x$ ($0.8 \leq x \leq 1.9$) is deposited as the variable resistance layer 2.

Next, in the process shown in FIG. 3(c), the TiAlN of the mask layer 23 is etched using a mixed gas of Ar, Cl, and trifluoromethane ($CHF_3$), with the photoresist film 24 as a mask.

Next, in the process shown in FIG. 4(a), the Pt of the upper electrode layer 1, the $TaO_x$ of the variable resistance layer 2, and the TaN of the lower electrode layer 3 are etched using a mixed gas having Ar and Cl as main components. At this time, the etching rate of Pt is 7.5 times higher than the etching rate of TiAlN, the etching rate of $TaO_x$ is about the same as the etching rate of TiAlN, and the etching rate of TaN is about 10 times higher than the etching rate of TiAlN. As such, since the TiAlN used as the mask layer is 100 nm thick, a stable shape can be obtained. In addition, since the mask layer is 100 nm thick, the connecting electrode layer 4 is made to be 70 nm thick since a thickness of 51 nm or more is sufficient.

Next, in the process shown in FIG. 4(b), the TiAlN of the connecting electrode layer 4 is etched at the same time as the TiAlN of the mask layer 23 is removed using a mixed gas of Ar, Cl, and $CHF_3$. At this time, since some over-etching is performed, the first insulating layer 14 is steadily etched to about 40 nm. In addition, by optimizing the over-etched amount, the etching amount for the first insulating layer 14 can be made to be 5 nm or less.

With the above-described dry-etching process, an upper region width 101 (shown in FIG. 1) in which the variable resistance layer 2 and the upper electrode layer 1 are in contact is formed to a width of 491 nm and a lower region width 102 in which the variable resistance layer 2 and the lower electrode layer 3 are in contact is formed to a width of 512 nm (both having a design value of 500 nm), and thus dimensional error from the design value for the upper region width 101 and the lower region width 102 can be kept to within 12 nm and, in terms of the surface area of the nonvolatile storage element 10, the shift in shape can be suppressed to within 5% of the design value.

In the etching of the lower electrode, the charge of etching plasma applied from the upper electrode-side flows through the variable resistance layer and flows to the lower electrode-side. With this charge, the oxygen and electron holes in the variable resistance layer move and the oxygen concentration distribution is disturbed, and characteristic deterioration, which is specific to variable resistance type storage devices and which causes variation in initial operation or operational characteristics, occurs.

Here, by using a material that is easier to etch than Pt, such as TaN and so on, as the lower electrode, it is possible to shorten etching time or lower etching power. With this, it becomes possible to lower the charge of the etching plasma applied to the variable resistance layer in the etching of the lower electrode, and the variation in the initial operation or operational characteristics can be reduced.

Furthermore, by placing a material having a higher standard electrode potential than the standard electrode potential of the metal included in the variable resistance layer 2 in the upper electrode (for example, Pt, or Ir, and so on), and placing a material having a lower standard electrode potential than the standard electrode potential of metal included in the variable resistance layer 2 in the lower electrode (for example, TaN, or Al, and so on), it becomes possible to selectively bring about resistance-variation at the vicinity of the interface of the electrode with a high standard electrode potential, and thus stable operation can be implemented.

It should be noted that the connecting electrode layer 4 may be made of a laminated structure of TiAlN and TiN. In such a case, the same advantageous effect can be obtained even when TiAlN is 50 nm thick and TiN is 20 nm thick in the previously described structure. Furthermore, the material of the mask layer 23 is not limited to TiAlN, and materials need not be limited to the combination of the aforementioned materials as long as they have etching rates that allow the etching rate of the lower electrode layer 3 or the upper electrode layer 1 to be about 7.5 times higher, or more than 7.5 times higher than the etching rate of the connecting electrode layer 4 and the mask layer 23 in the forming of the upper electrode layer 1 or the lower electrode layer 3 by etching. For example, the same advantageous effect can be obtained even when TiN is used as the mask layer 23.

In addition, the same advantageous effect can be obtained even when Ir is used instead of Pt in the upper electrode layer 1.

In the nonvolatile storage element in the first embodiment, a film thickness ($t_{ce}$) of the connecting electrode layer is: (i) thicker than a film thickness ($t_{m2}=t_{m1} \times ER_{ce}/ER_{m2}$) obtained by multiplying, with an etching rate ($ER_{ce}$) of the connecting electrode layer when a region of the connecting electrode layer that has been exposed by three-layer etching is removed during removal of the mask layer, a value obtained by dividing, by an etching rate ($ER_{m2}$) of the mask layer when the region of the connecting electrode layer that has been exposed by the three-layer etching is removed during the removal of the mask layer, a film thickness ($t_{m1}=t_m-t_{ue1}-t_{r1}-t_{le1}$) obtained by subtracting, from a film thickness ($t_m$) of the mask layer: a film thickness ($t_{ue1}=t_{ue} \times ER_{m1}/ER_{ue}$) obtained by multiplying, with the etching rate ($ER_{m1}$) of the mask layer during the three-layer etching, a value obtained by dividing a film thickness ($t_{ue}$) of the upper electrode layer by an etching rate ($ER_{ue}$) of the upper electrode layer during the three-layer etching; a film thickness ($t_{r1}=t_r \times ER_{m1}/ER_r$) obtained by multiplying, with the etching rate ($ER_{m1}$) of the mask layer during the three-layer etching, a value obtained by dividing a film thickness ($t_r$) of the variable resistance layer by an etching rate ($ER_r$) of the variable resistance layer during the three-layer etching; and a film thickness ($t_{le1}=t_{le} \times ER_{m1}/ER_{le}$) obtained by multiplying, with the etching rate ($ER_{m1}$) of the mask layer during the three-layer etching, a value obtained by dividing a film thickness ($t_{le}$) of the lower electrode layer by an etching rate ($ER_{le}$) of the lower electrode layer during the three-layer etching, and (ii) thinner than a film thickness ($=t_{m2}+t_{ue2}$) obtained by adding: (a) the film thickness ($t_{m2}=t_{m1} \times ER_{ce}/ER_{m2}$) obtained by multiplying, with the etching rate ($ER_{ce}$) of the connecting electrode layer when the region of the connecting electrode layer that has been exposed by the three-layer etching is removed during the removal of the mask layer, the value obtained by dividing, by the etching rate ($ER_{m2}$) of the mask layer when the region of the connecting electrode layer that has been exposed by the three-layer etching is removed during the removal of the mask layer, the film thickness ($t_{m1}=t_m-t_{ue} \times ER_{m1}/ER_{ue}-t_r \times ER_{m1}/ER_r-t_{le} \times ER_{m1}/ER_{le}$) obtained by subtracting, from the ($t_m$) film thickness of the mask layer: the film thickness ($=t_{ue} \times ER_{m1}/ER_{ue}$) obtained by multiplying, with the etching rate ($ER_{m1}$) of the mask layer during the three-layer etching, the value obtained by dividing a film thickness ($t_{ue}$) of the upper electrode layer by the etching rate ($ER_{ue}$) of the upper electrode layer during the three-layer etching; the film thickness ($=t_r \times ER_{m1}/ER_r$) obtained by multiplying, with the etching rate ($ER_{m1}$) of the mask layer during the three-layer etching, the value obtained by dividing the film thickness ($t_r$) of the variable resistance layer by the etching rate ($ER_r$) of the variable resistance layer during the three-layer etching; and the film thickness ($=t_{le} \times ER_{m1}/ER_{le}$) obtained by multiplying, with the etching rate ($ER_{m1}$) of the mask layer during the three-layer etching, the value obtained by dividing the film thickness ($t_{le}$) of the lower electrode layer by the etching rate ($ER_{le}$) of the lower electrode layer during the three-layer etching, and (b) a film thickness ($t_{ue2}=t_{ue} \times ER_{ce}/ER_{ue2}$) obtained by multiplying, with the etching rate ($ER_{ce}$) of the connecting electrode layer during simultaneous removal of the mask layer and the region of the connecting electrode layer that has been exposed by the three-layer etching, a value obtained by dividing the film thickness ($t_{ue}$) of the upper electrode layer by an etching rate ($ER_{ue2}$) of the upper electrode layer when the region of the connecting electrode layer that has been exposed by the three-layer etching is removed during the removal of the mask layer.

In other words, it is sufficient to determine the film thickness ($t_{ce}$) of the connecting electrode layer so that the following relationship is satisfied:

$$t_{m2} < t_{ce} < t_{m2} + t_{ue2} \quad (1)$$

Here, $t_{ue1}$, $t_{r1}$, and $t_{le1}$, are converted film thicknesses obtained when the film thickness of the upper electrode layer, the film thickness of the variable resistance layer, and the film thickness of the lower electrode layer, respectively, are converted into the film thickness of the mask layer in consideration of the etching rate. Therefore, $t_{m1}$ is the remaining film thickness of the mask layer after the end of the three-layer etching process. In addition, $t_{m2}$ is obtained by converting the remaining mask layer into the film thickness of the connecting electrode layer in consideration of the etching rate, in removing the remaining mask layer simultaneously with the connecting electrode layer. The relationship in the left part of expression (1) denotes a relational expression defining a first condition in which the connecting electrode layer is not the first to be eliminated when the entire mask layer remaining after the end of the three-layer etching process is removed.

Furthermore, in the right part of expression (1), $t_{ue2}$ is the converted film thickness obtained when the remaining film thickness of the upper electrode layer in the further etching of the connecting electrode layer after removing the entire mask layer remaining after the end of the three-layer etching process is converted into the film thickness of the connecting electrode layer in consideration of the etching rate. Therefore, the relationship in the right part of expression (1) denotes a relational expression in which a second condition is that the upper electrode layer is not the first to be eliminated when the entire connecting electrode layer is removed after removing the entire mask layer remaining after the end of the three-layer etching process. In the actual process, in order to remove the entire connecting electrode layer in the region exposed by the three-layer etching process, over-etching is necessary and, during such time, the first insulating layer 14 is slightly etched. Furthermore, since a contact plug is to be formed in the upper electrode layer in order to obtain contact between the wiring and a higher layer, the remaining film thickness of the upper electrode layer needs to be about 15 to 20 nm or more.

Second Embodiment

Figure 5A:
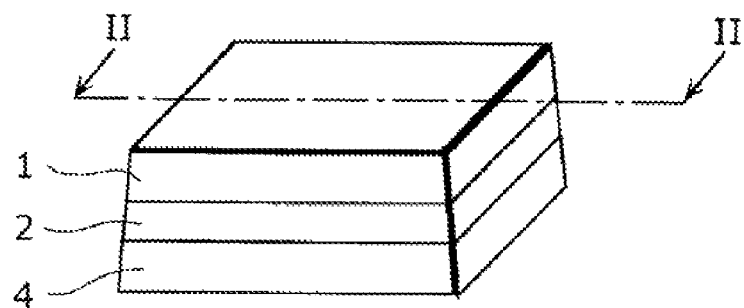
FIG. 5(a) is a perspective view showing schematically the structure of the main section of a storage portion of a nonvolatile storage element according to a second embodiment of the present invention.
Figure 5B:
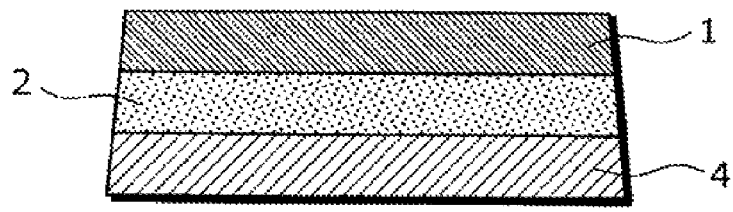
FIG. 5(b) is a cross-sectional view showing a cross-section along the II-II line in FIG. 5(a).

FIG. 5(a) is a perspective view showing schematically the structure of a main section of a storage portion of a nonvolatile storage element 20 in second embodiment of the present invention. FIG. 5(b) is a cross-sectional view showing a cross-section along the II-II line in FIG. 5(a).

As shown in FIG. 5(a) and FIG. 5(b), the nonvolatile storage element 20 includes the upper electrode layer 1 formed above the connecting electrode layer 4. The variable resistance layer 2 is formed between the connecting electrode layer and the upper electrode layer 1.

Figure 6:
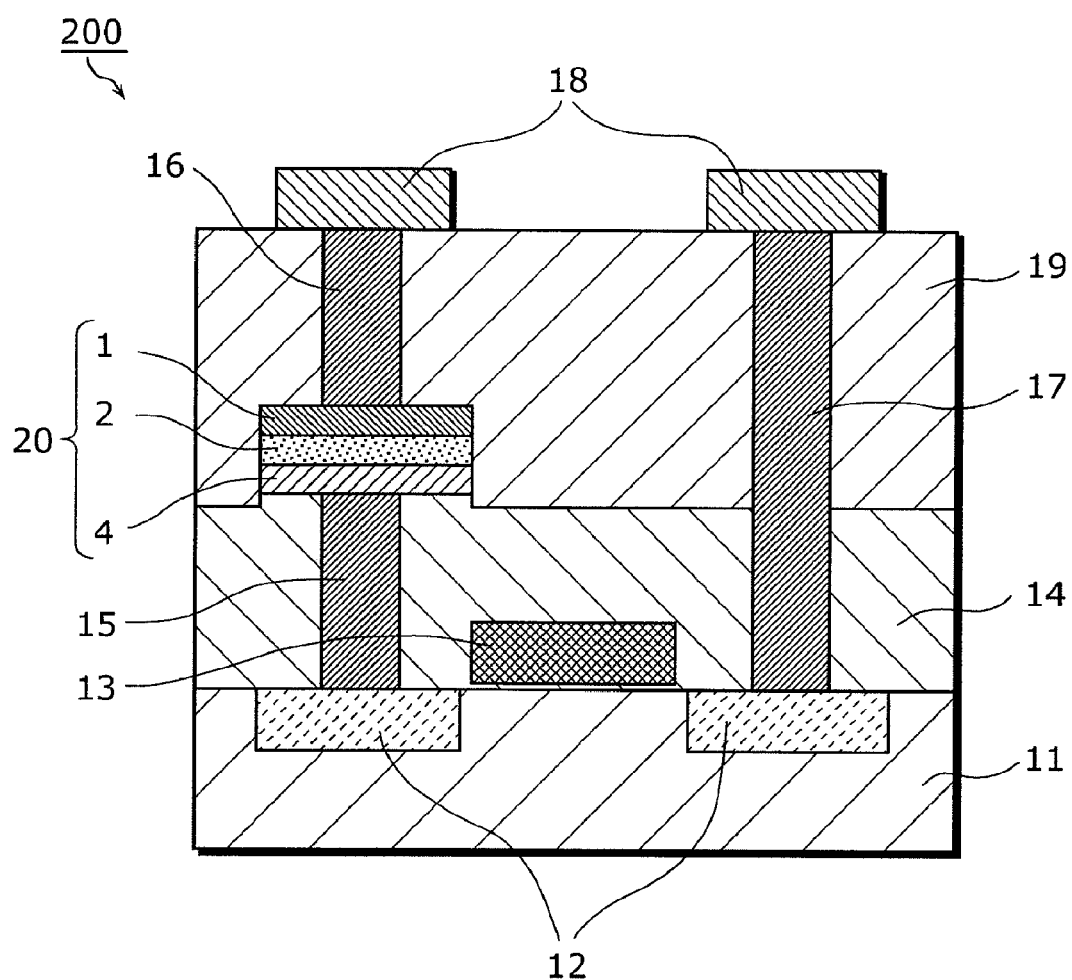
FIG. 6 is a cross-sectional view showing the specific structure of a nonvolatile storage device equipped with the nonvolatile storage element according to the second embodiment of the present invention.

Furthermore, FIG. 6 is a cross-sectional view showing the specific structure of a nonvolatile storage device 200 equipped with the nonvolatile storage element 20 in the second embodiment. As such, the nonvolatile storage device 200 includes the upper electrode layer 1 formed above the connecting electrode layer 4. The nonvolatile storage element 20 has the variable resistance layer 2 formed between the connecting electrode layer and the upper electrode layer 1. Furthermore, although several nonvolatile storage elements are formed on a substrate, here only one nonvolatile storage element is illustrated in order to simplify the Drawings. Furthermore, a part thereof has been magnified to facilitate comprehension.

It should be noted that since the other components of the nonvolatile storage device 200 are the same as in the case of the nonvolatile storage device 100, the same reference signs are assigned and description shall be omitted.

FIGS. 7(a) to (c) and FIGS. 8(a) to (c) are cross-sectional views showing the processes in the method for manufacturing the nonvolatile storage element 20 and the nonvolatile storage device 200 in the second embodiment of the present invention. Aside from the subsequent point, they are the same as those for the method for manufacturing the nonvolatile storage element 10 and the nonvolatile storage device 100.

Figure 7A:
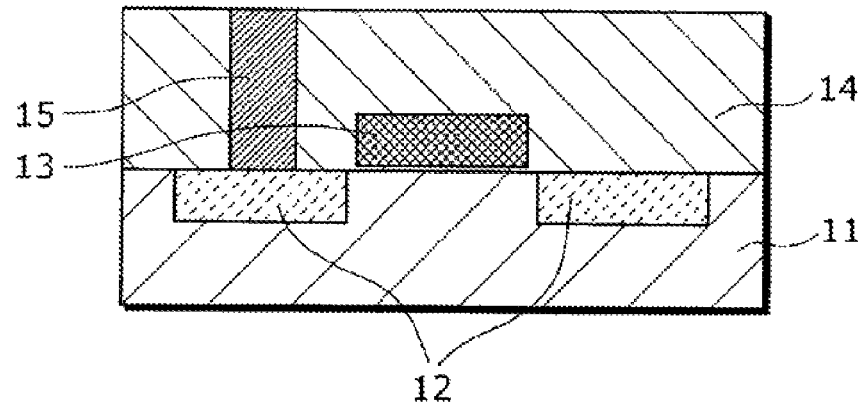
FIGS. 7(a) to (c) are cross-sectional views showing the processes in a method for manufacturing the nonvolatile storage device according to the second embodiment of the present invention.
Figure 7B:
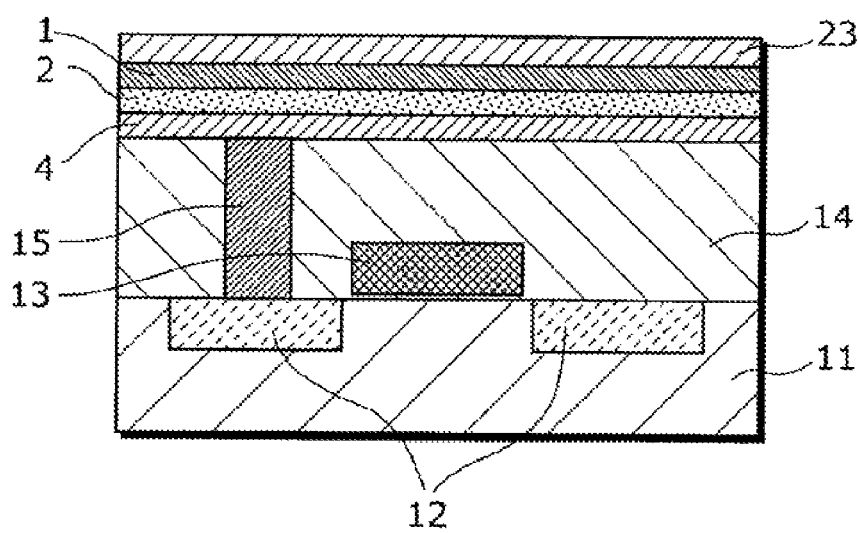
Figure 7C:
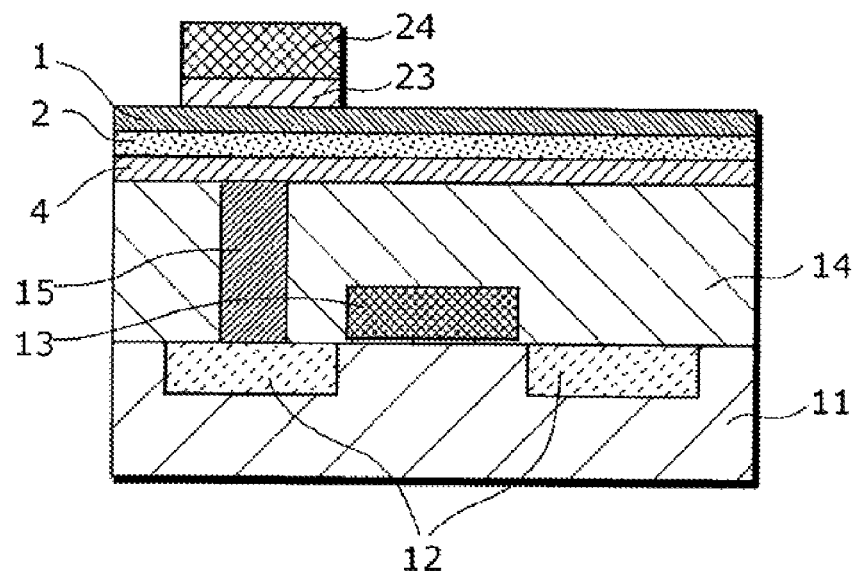

The point of difference from the method for manufacturing the nonvolatile storage element 10 and the nonvolatile storage device 100 is that, in the process shown in FIG. 7(b), the connecting electrode layer 4, the variable resistance layer 2, and the upper electrode layer 1 which make up the nonvolatile storage element 20, and the mask layer 23, are formed in such sequence above the first insulating layer 14 so as to cover the first contact 15. It is preferable that the mask layer 23 and the connecting electrode layer 4 have the same etching rates. Here, TiAlN is used in both. As in the first embodiment, their film thicknesses are 100 nm and 70 nm, respectively.

Figure 8A:
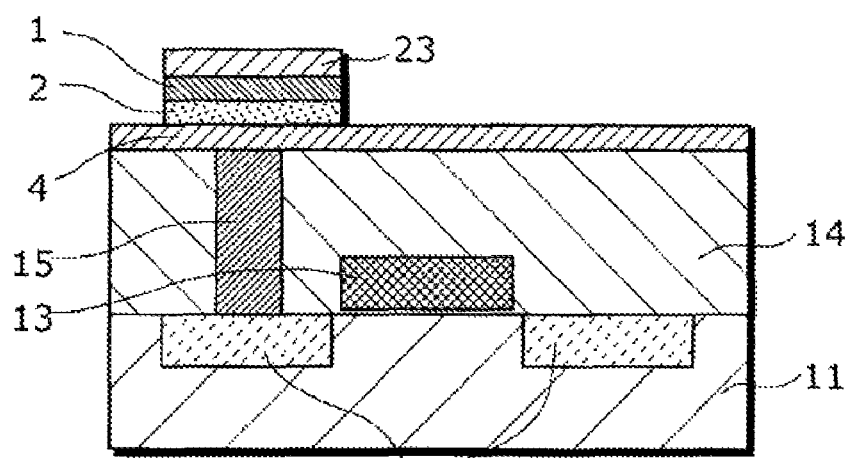
FIGS. 8(a) to (c) are cross-sectional views showing the processes in the method for manufacturing the nonvolatile storage device according to the second embodiment of the present invention.

Next, in the process shown in FIG. 8(a), after removing the photoresist film 24, the upper electrode layer 1 and the variable resistance layer 2 are formed into the predetermined shape in a single etching process using a dry etching process with the mask layer 23 as a mask. This process is called the two-layer etching process.

Figure 8B:
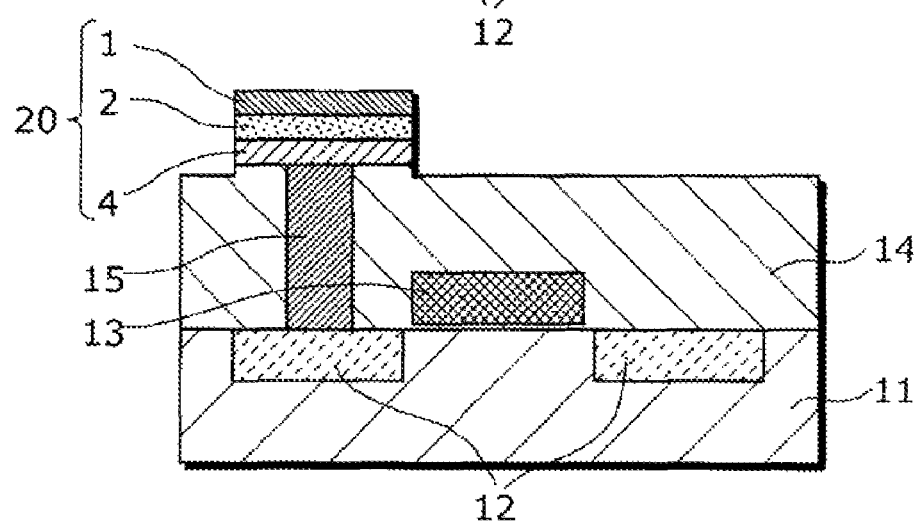
Figure 8C:
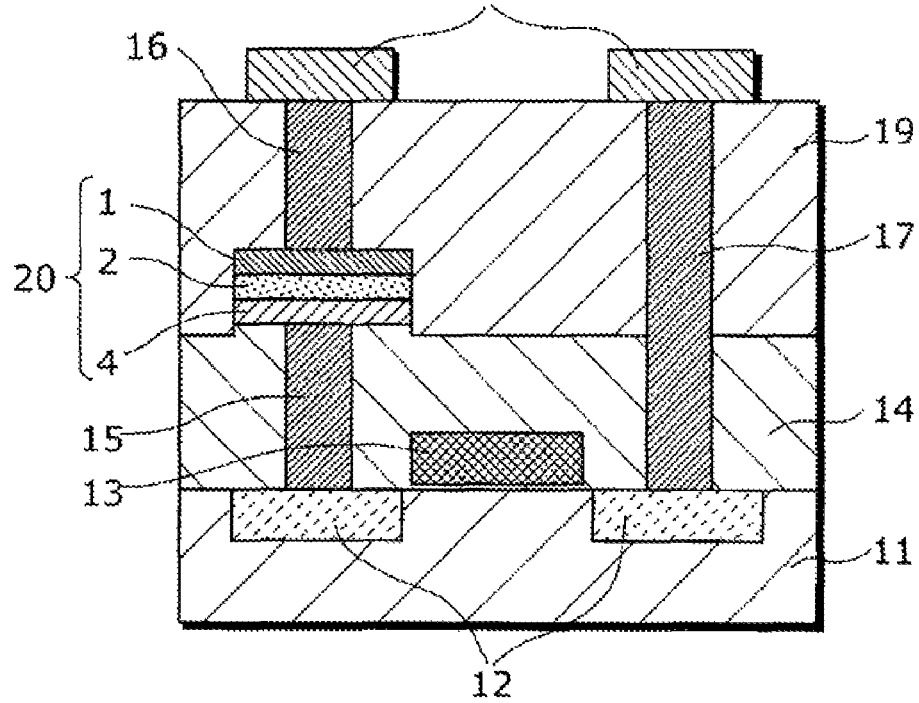
Figure 9:
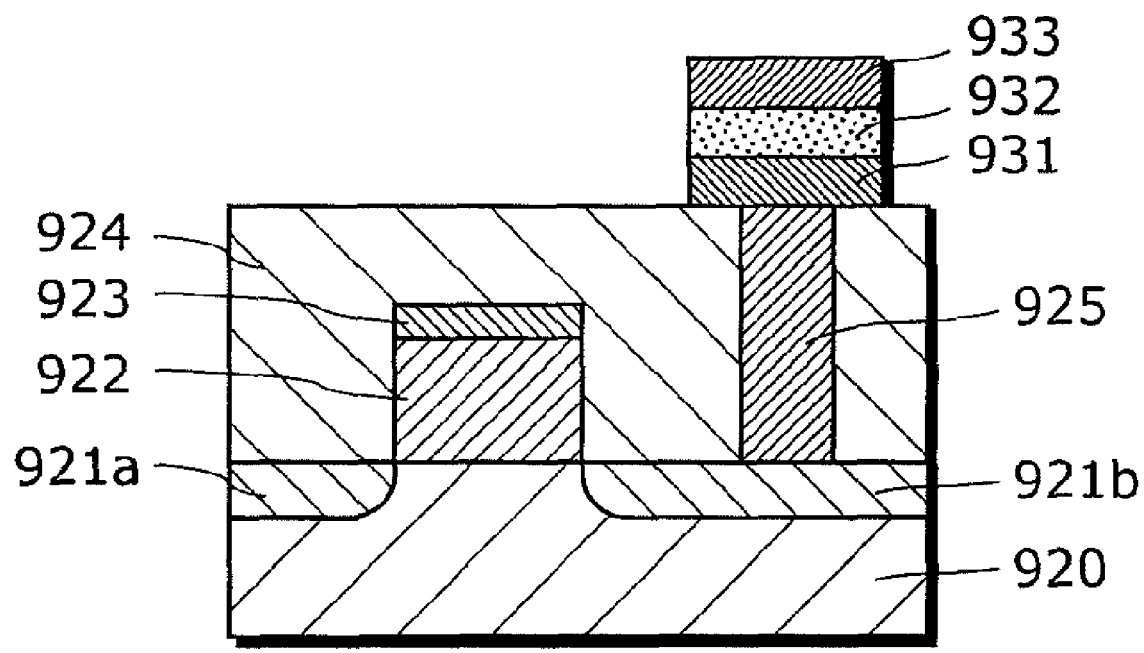
FIG. 9 is a main section cross-sectional view showing the structure of a conventional nonvolatile storage element.

Next, in the process shown in FIG. 8(b), the region of the connecting electrode layer 4, which has been exposed by the two-layer etching process, is removed using a dry etching process. At that time, since the mask layer 23 is also removed at the same time, the nonvolatile storage element 20 including the upper electrode layer 1, the variable resistance layer 2, and the connecting electrode layer 4, and having a shape in which the side surfaces of the upper electrode layer 1, the variable resistance layer 2, and the connecting electrode layer 4 make up the same surface plane, is formed.

At this time, the connecting electrode layer 4 functions as a lower electrode in the nonvolatile storage element 20.

It should be noted that the advantageous effects of being able to minimize dimensional shift, and so on, can also be obtained with the nonvolatile storage element 20 and the nonvolatile storage device 200, in the same manner as in the nonvolatile storage element 10 and the nonvolatile storage device 100, even when the above-described materials and film thicknesses are used in each of the upper electrode layer 1, the variable resistance layer 2, and the connecting electrode layer 4.

In the nonvolatile storage element in the second embodiment, a film thickness ($t_{ce}$) of the connecting electrode layer is: (i) thicker than a film thickness ($t_{m2} = t_{m1} \times ER_{ce}/ER_{m2}$) obtained by multiplying, with an etching rate ($E_{ce}$) of the connecting electrode layer when a region of the connecting electrode layer that is that has been exposed by two-layer etching is removed during removal of the mask layer, a value obtained by dividing, by an etching rate ($ER_{m2}$) of the mask layer when the region of the connecting electrode layer that has been exposed by the two-layer etching is removed during the removal of the mask layer, a film thickness ($t_{m1} = t_m - t_{ue1} - t_{r1}$) obtained by subtracting, from a film thickness ($t_m$) of the mask layer: a film thickness ($t_{ue1} = t_{ue} \times ER_{m1}/ER_{ue}$) obtained by multiplying, with the etching rate ($ER_{m1}$) of the mask layer during two-layer etching, a value obtained by dividing a film thickness ($t_{ue}$) of the upper electrode layer by an etching rate ($ER_{ue}$) of the upper electrode layer during the two-layer etching; and a film thickness ($t_{r1}=t_r \times ER_{m1}/ER_r$) obtained by multiplying, with the etching rate ($ER_{m1}$) of the mask layer during the two-layer etching, a value obtained by dividing a film thickness ($t_r$) of the variable resistance layer by an etching rate ($ER_r$) of the variable resistance layer during the two-layer etching, and (ii) thinner than a film thickness ($=t_{m2}+t_{ue2}$) obtained by adding: (a) a film thickness ($=t_{m1} \times ER_{ce}/ER_{m2}$) obtained by multiplying, with an etching rate ($ER_{ce}$) of the connecting electrode layer when a region of the connecting electrode layer that is not covered by the lower electrode layer is removed during the removal of the mask layer, a value obtained by dividing, by an etching rate ($ER_{m2}$) of the mask layer when the region of the connecting electrode layer that has been exposed by the two-layer etching is removed during the removal of the mask layer, a film thickness ($t_{m1}=t_m-t_{ue} \times ER_{m1}/ER_{ue}-t_r \times ER_{m1}/ER_r$) obtained by subtracting, from the film thickness ($t_m$) of the mask layer: the film thickness ($=t_{ue} \times ER_{m1}/ER_{ue}$) obtained by multiplying, with the etching rate ($ER_{m1}$) of the mask layer during the two-layer etching, the value obtained by dividing the film thickness ($t_{ue}$) of the upper electrode layer by the etching rate ($ER_{ue}$) of the upper electrode layer during the two-layer etching; and the film thickness ($=t_r \times ER_{m1}/ER_r$) obtained by multiplying, with the etching rate ($ER_{m1}$) of the mask layer during the two-layer etching, the value obtained by dividing the film thickness ($t_r$) of the variable resistance layer by the etching rate ($ER_r$) of the variable resistance layer during the two-layer etching, and (b) a film thickness ($t_{ue2}=t_{ue} \times ER_{ce}/ER_{ue2}$) obtained by multiplying, with the etching rate ($ER_{ce}$) of the connecting electrode layer when the region of the connecting electrode layer that has been exposed by the two-layer etching is removed during the removal of the mask layer, a value obtained by dividing the film thickness ($t_{ue}$) of the upper electrode layer by an etching rate ($ER_{ue2}$) of the upper electrode layer when the region of the connecting electrode layer that has been exposed by the two-layer etching is removed during the removal of the mask layer.

In other words, it is sufficient to determine the film thickness ($t_{ce}$) of the connecting electrode layer so that the following relationship is satisfied:

$$t_{m2} < t_{ce} < t_{m2} + t_{ue2} \quad (2)$$

Here, $t_{ue1}$ and $t_{r1}$ are converted film thicknesses obtained when the film thickness of the upper electrode layer and the film thickness of the variable resistance layer, respectively, are converted into the film thickness of the mask layer in consideration of the etching rate. Therefore, tm1 is the remaining film thickness of the mask layer after the end of the two-layer etching process. In addition, $t_{m2}$ is obtained by converting the remaining mask layer into the film thickness of the connecting electrode layer in consideration of the etching rate, in removing the remaining mask layer simultaneously with the connecting electrode layer. The relationship in the left part of expression (2) denotes a relational expression in which a first condition is that the connecting electrode layer is not the first to be eliminated when the entire mask layer remaining after the end of the two-layer etching process is removed.

Furthermore, in the right part of expression (2), $t_{ue2}$ is the converted film thickness obtained when the remaining film thickness of the upper electrode layer in the further etching of the connecting electrode layer after removing the entire mask layer remaining after the end of the two-layer etching process is converted into the film thickness of the connecting electrode layer in consideration of the etching rate. Therefore, the relationship in the right part of expression (2) denotes a relational expression in which a second condition is that the upper electrode layer is not the first to be eliminated when the entire connecting electrode layer is removed after removing the entire mask layer remaining after the end of the two-layer etching process. In the actual process, in order to remove the entire connecting electrode layer in the region exposed by the two-layer etching process, over-etching is necessary and, during such time, the first insulating layer 14 is slightly etched. Furthermore, since a contact plug is to be formed in the upper electrode layer in order to obtain contact between the wiring and a higher layer, the remaining film thickness of the upper electrode layer needs to be about 15 to 20 nm or more.

INDUSTRIAL APPLICABILITY

The nonvolatile storage element and the nonvolatile storage device in the present invention allow high-speed operation and have stable rewriting characteristics, and are useful as a nonvolatile storage element, and the like, used in various electronic devices such as a digital household appliance, a memory card, a mobile phone, and a personal computer.

The invention claimed is:

1. A manufacturing method of a nonvolatile storage element which includes a connecting electrode layer which is conductive, a lower electrode layer which is made of a non-noble metal nitride and is conductive, an upper electrode layer which is formed above the lower electrode layer and is made of a noble metal, and a variable resistance layer disposed between the lower electrode layer and the upper electrode layer and whose resistance value varies reversibly based on an electrical signal applied between the lower electrode layer and the upper electrode layer, wherein the variable resistance layer includes electron holes and oxygen which move upon application of a charge in etching plasma, said method comprising:

depositing, in sequence, the connecting electrode layer, the lower electrode layer, the variable resistance layer, the upper electrode layer, and a mask layer;

forming the mask layer into a predetermined shape, using a photoresist film as a mask;

performing three-layer etching on the upper electrode layer, the variable resistance layer, and the lower electrode layer, using the mask layer that has been formed into the predetermined shape as a mask, to form the upper electrode layer, the variable resistance layer, and the lower electrode layer into the predetermined shape, so as to expose a region of the connecting electrode layer, the etching being performed with a higher etching rate for the non-noble metal nitride than an etching rate for the noble metal of the upper electrode layer; and removing, simultaneously, the mask layer and the region of the connecting electrode layer exposed in said performing of the three-layer etching.

2. The manufacturing method according to claim 1, wherein, in said performing of the three-layer etching, the upper electrode layer, the variable resistance layer, and the lower electrode layer are formed into the predetermined shape in a single etching process using the mask layer as a mask.

3. The manufacturing method according to claim 1, wherein an etching rate of the mask layer in said performing of the three-layer etching is lower than at least an etching rate of the photoresist film in said performing of the three-layer etching.

4. The manufacturing method according to claim 1,
wherein the upper electrode layer is made of Pt or Ir, the lower electrode layer is made of TaN, and the connecting electrode layer is made of TiAlN.

5. The manufacturing method according to claim 1,
wherein said connecting electrode layer has a same etching rate as said mask layer.

6. The manufacturing method according to claim 1,
wherein said connecting electrode layer is made of a same material as said mask layer.

7. A manufacturing method of a nonvolatile storage element which includes a connecting electrode layer which is conductive, an upper electrode layer which is formed above the connecting electrode layer and is made of a noble metal, and a variable resistance layer disposed between the connecting electrode layer and the upper electrode layer and whose resistance value varies reversibly based on an electrical signal applied between the connecting electrode layer and the upper electrode layer,
wherein the variable resistance layer includes electron holes and oxygen which move upon application of a charge in etching plasma,
said method comprising:
depositing, in sequence, the connecting electrode layer, the variable resistance layer, the upper electrode layer, and a mask layer;
forming the mask layer into a predetermined shape, using a photoresist film as a mask;
performing two-layer etching on the upper electrode layer and the variable resistance layer, using the mask layer that has been formed into the predetermined shape as a mask, to form the upper electrode layer and the variable resistance layer into the predetermined shape, so as to expose a region of the connecting electrode layer; and
removing, simultaneously, the mask layer and the region of the connecting electrode layer exposed in said performing of the two-layer etching.

8. The manufacturing method according to claim 7,
wherein, in said performing of the two-layer etching, the upper electrode layer and the variable resistance layer are formed into the predetermined shape in a single etching process using the mask layer as a mask.

9. The manufacturing method according to claim 7,
wherein an etching rate of the mask layer in said performing of the two-layer etching is lower than at least an etching rate of the photoresist film in said performing of the two-layer etching.

10. The manufacturing method according to claim 7,
wherein the upper electrode layer is made of Pt or Ir, and the connecting electrode layer is made of TiAlN.

11. The manufacturing method according to claim 7,
wherein the connecting electrode layer has a same etching rate as the mask layer.

12. The manufacturing method according to claim 7,
wherein the connecting electrode layer is made of a same material as the mask layer.

13. A manufacturing method of a nonvolatile storage device which includes a semiconductor substrate, word lines and bit lines which are formed on the semiconductor substrate and arranged so as to intersect with each other, transistors each provided for a corresponding one of intersections of the word lines and the bit lines, and nonvolatile storage elements each provided for a corresponding one of the transistors, each of the nonvolatile storage elements including a connecting electrode layer which is conductive, a lower electrode layer which is made of a non-noble metal nitride and is conductive, an upper electrode layer which is formed above the lower electrode layer and is made of a noble metal, and a variable resistance layer disposed between the lower electrode layer and the upper electrode layer and whose resistance value varies reversibly based on an electrical signal applied between the lower electrode layer and the upper electrode layer,
wherein the variable resistance layer includes electron holes and oxygen which move upon application of a charge in etching plasma,
said method comprising:
depositing, in sequence, the connecting electrode layer, the lower electrode layer, the variable resistance layer, the upper electrode layer, and a mask layer;
forming the mask layer into a predetermined shape, using a photoresist film as a mask;
performing three-layer etching on the upper electrode layer, the variable resistance layer, and the lower electrode layer, using the mask layer that has been formed into the predetermined shape as a mask, to form the upper electrode layer, the variable resistance layer, and the lower electrode layer into the predetermined shape, so as to expose a region of the connecting electrode layer, the etching being performed with a higher etching rate for the non-noble metal nitride than an etching rate for the noble metal of the upper electrode layer;
removing, simultaneously, the mask layer and the region of the connecting electrode layer exposed in said performing of the three-layer etching; and
forming, on the semiconductor substrate, the corresponding one of the transistors and a semiconductor integrated circuit which are electrically connected to the connecting electrode layer and the upper electrode layer.

14. The manufacturing method according to claim 13,
wherein, in said performing of the three-layer etching, the upper electrode layer, the variable resistance layer, and the lower electrode layer are formed into the predetermined shape in a single etching process using the mask layer as a mask.

15. A manufacturing method of a nonvolatile storage device which includes a semiconductor substrate, word lines and bit lines which are formed on the semiconductor substrate and arranged so as to intersect with each other, transistors each provided for a corresponding one of intersections of the word lines and the bit lines, and nonvolatile storage elements each provided for a corresponding one of the transistors, each of the nonvolatile storage elements including a connecting electrode layer which is conductive, an upper electrode layer which is formed above the connecting electrode layer and is made of a noble metal, and a variable resistance layer disposed between the connecting electrode layer and the upper electrode layer and whose resistance value varies reversibly based on an electrical signal applied between the connecting electrode layer and the upper electrode layer,
wherein the variable resistance layer includes electron holes and oxygen which move upon application of a charge in etching plasma,
said method comprising:
depositing, in sequence, the connecting electrode layer, the variable resistance layer, the upper electrode layer, and a mask layer;
forming the mask layer into a predetermined shape, using a photoresist film as a mask;
performing two-layer etching on the upper electrode layer and the variable resistance layer, using the mask layer that has been formed into the predetermined shape as a mask, to form the upper electrode layer and the variable resistance layer into the predetermined shape, so as to expose a region of the connecting electrode layer;

removing, simultaneously, the mask layer and the region of the connecting electrode layer exposed in said performing of the two-layer etching; and forming, on the semiconductor substrate, the corresponding one of the transistors and a semiconductor integrated circuit which are electrically connected to the connecting electrode layer and the upper electrode layer.

16. he manufacturing method according to claim 15, wherein, in said performing of the two-layer etching, the upper electrode layer and the variable resistance layer are formed into the predetermined shape in a single etching process using the mask layer as a mask.

* * * * *